United States Patent
Lynch et al.

(10) Patent No.: US 9,015,563 B2
(45) Date of Patent: Apr. 21, 2015

(54) APPARATUS, SYSTEM AND METHOD FOR MERGING CODE LAYERS FOR AUDIO ENCODING AND DECODING AND ERROR CORRECTION THEREOF

(71) Applicant: The Nielsen Company (US), LLC, Schaumburg, IL (US)

(72) Inventors: Wendell Lynch, East Lansing, MI (US); John Stavropoulos, Edison, NJ (US); David Gish, Riverdale, NJ (US); Alan Neuhauser, Silver Spring, MD (US)

(73) Assignee: The Nielsen Company (US), LLC, Schaumburg, IL (US)

( * ) Notice: Subject to any disclaimer, the term of this patent is extended or adjusted under 35 U.S.C. 154(b) by 0 days.

(21) Appl. No.: 14/023,226

(22) Filed: Sep. 10, 2013

(65) Prior Publication Data

US 2015/0039972 A1 Feb. 5, 2015

Related U.S. Application Data

(63) Continuation of application No. 13/955,438, filed on Jul. 31, 2013.

(51) Int. Cl.
*H03M 13/00* (2006.01)
*H03M 13/05* (2006.01)

(52) U.S. Cl.
CPC ........................... *H03M 13/05* (2013.01)

(58) Field of Classification Search
CPC .............................. H04L 7/048; H04L 1/0057
USPC ........................... 714/775, 755; 704/500
See application file for complete search history.

(56) References Cited

U.S. PATENT DOCUMENTS

| | | | |
|---|---|---|---|
| 5,450,490 A | 9/1995 | Jensen et al. | |
| 5,574,962 A | 11/1996 | Fardeau et al. | |
| 5,579,124 A | 11/1996 | Aijala et al. | |
| 5,581,800 A | 12/1996 | Fardeau et al. | |
| 5,764,763 A | 6/1998 | Jensen et al. | |
| 5,787,334 A | 7/1998 | Fardeau et al. | |
| 6,845,360 B2 * | 1/2005 | Jensen et al. | 704/500 |
| 6,871,180 B1 | 3/2005 | Neuhauser et al. | |
| 7,640,141 B2 | 12/2009 | Kolessar et al. | |
| 8,255,763 B1 * | 8/2012 | Yang et al. | 714/755 |
| 2006/0280246 A1 | 12/2006 | Alattar et al. | |

OTHER PUBLICATIONS

U.S. Appl. No. 13/955,245, filed Jul. 31, 2013, 31 pages.
U.S. Appl. No. 14/023,221, filed Sep. 10, 2013, 44 pages.
ARBITRON, "Critical Band Encoding Technology Audio Encoding System From Arbitron," Feb. 2008, 27 pages.

* cited by examiner

*Primary Examiner* — Fritz Alphonse
(74) *Attorney, Agent, or Firm* — Hanley, Flight & Zimmerman, LLC

(57) ABSTRACT

Apparatus, system and method for encoding and decoding ancillary code for digital audio, where multiple encoding layers are merged. The merging allows a greater number of ancillary codes to be embedded into the encoding space, and further introduces efficiencies in the encoding process. Utilizing certain error correction techniques, the decoding of ancillary code may be improved and made more reliable.

20 Claims, 13 Drawing Sheets

FIG. 12 — Message Positions for (15,9) code / Data symbol soft metrics (0–15)

| Soft metric \ Msg pos | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 0 | 35 | 9 | 5 | 50 | 20 | 47 | 14 | 27 | 1 | 36 | 7 | 34 | 22 | 34 | 125 |
| 1 | 17 | 28 | 47 | 22 | 3 | 28 | 120 | 32 | 9 | 50 | 48 | 41 | 36 | 25 | 12 |
| 2 | 10 | 4 | 49 | 1 | 31 | 41 | 8 | 9 | 31 | 1 | 6 | 7 | 47 | 46 | 30 |
| 3 | 39 | 110 | 8 | 27 | 10 | 46 | 20 | 99 | 14 | 19 | 50 | 37 | 24 | 32 | 26 |
| 4 | 20 | 30 | 41 | 28 | 6 | 33 | 44 | 47 | 89 | 8 | 40 | 27 | 30 | 20 | 42 |
| 5 | 1 | 1 | 29 | 33 | 12 | 93 | 18 | 20 | 23 | 49 | 47 | 7 | 70 | 9 | 38 |
| 6 | 100 | 30 | 48 | 6 | 23 | 4 | 10 | 42 | 29 | 33 | 8 | 38 | 9 | 20 | 25 |
| 7 | 31 | 23 | 37 | 14 | 7 | 32 | 19 | 28 | 42 | 21 | 42 | 62 | 44 | 50 | 28 |
| 8 | 47 | 32 | 10 | 39 | 107 | 43 | 2 | 11 | 27 | 10 | 29 | 2 | 25 | 16 | 48 |
| 9 | 35 | 5 | 60 | 8 | 37 | 34 | 18 | 39 | 14 | 20 | 15 | 18 | 38 | 12 | 11 |
| 10 | 34 | 49 | 23 | 44 | 4 | 39 | 36 | 11 | 36 | 52 | 27 | 46 | 23 | 9 | 34 |
| 11 | 45 | 15 | 9 | 36 | 21 | 35 | 8 | 18 | 0 | 34 | 3 | 34 | 10 | 39 | 0 |
| 12 | 0 | 22 | 46 | 97 | 20 | 24 | 1 | 44 | 35 | 2 | 44 | 8 | 29 | 3 | 1 |
| 13 | 35 | 49 | 28 | 36 | 38 | 5 | 37 | 49 | 22 | 19 | 45 | 25 | 45 | 34 | 7 |
| 14 | 48 | 17 | 8 | 35 | 44 | 18 | 3 | 17 | 42 | 48 | 35 | 31 | 3 | 1 | 45 |
| 15 | 4 | 21 | 10 | 4 | 15 | 14 | 22 | 31 | 23 | 4 | 44 | 41 | 0 | 54 | 23 |

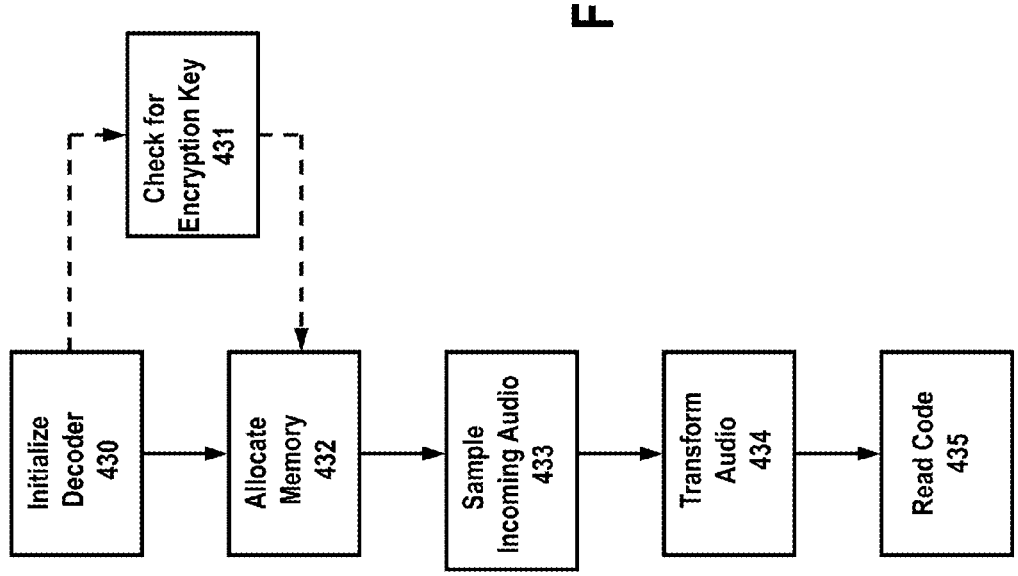

APPARATUS, SYSTEM AND METHOD FOR MERGING CODE LAYERS FOR AUDIO ENCODING AND DECODING AND ERROR CORRECTION THEREOF

TECHNICAL FIELD

The present disclosure relates to audio encoding and decoding for determining characteristics of media data. More specifically, the present disclosure relates to techniques for embedding data into audio and reading the embedded data for audience measurement purposes, and for correction of errors therein.

BACKGROUND INFORMATION

There has been considerable interest in monitoring the use of mobile terminals, such as smart phones, tablets, laptops, etc. for audience measurement and/or marketing purposes. In the area of media exposure monitoring, ancillary audio codes have shown themselves to be particularly effective in assisting media measurement entities to determine and establish media exposure data. One technique for encoding and detecting ancillary audio codes is based on Critical Band Encoding Technology (CBET), pioneered by Arbitron Inc., which is currently being used in conjunction with a special-purpose Personal People Meters (PPM™) to detect codes via ambient encoded audio.

Conventional CBET encoding and decoding is based on multiple layers, where message code symbols are encoded into separate parallel encoding layers, resulting in tens of thousands of possible codes that may be used to identify and/or characterize media. While such configurations have proven to be advantageous, thousands of codes may not be sufficient to identify and/or characterize larger media collections, which may number in the millions or billions. Accordingly, techniques are needed to be able to include much larger amounts of code data within audio. Also, techniques are needed to be able to merge or "fold" encoding layers so that more efficient coding may be enabled. Furthermore, techniques for error correction are needed to ensure that merged layer are properly encoded and/or decoded.

BRIEF SUMMARY

Under one exemplary embodiment, a method is disclosed for decoding audio data acoustically embedded with a message structure comprising a sequence of message symbols coexisting within two encoded layers along the time base of the audio data, each message symbol comprising a combination of substantially single-frequency components and a predefined symbol interval within a time base of the audio data, where the method comprises the steps of detecting the substantially single-frequency components of the message symbols; and detecting the message symbols based on the detected substantially single-frequency components thereof, wherein the detection is based at least in part on a synchronization of the message symbols between the two encoded layers. The method may further comprise the step of performing error correction on at least some of the detected message symbols, wherein the error correction comprises a Reed-Solomon error correction or a convolutional code error correction.

Under another exemplary embodiment, a decoder is disclosed that is configured to decode audio data acoustically embedded with a message structure comprising a sequence of message symbols coexisting within two encoded layers along the time base of the audio data, each message symbol comprising a combination of substantially single-frequency components and a predefined symbol interval within a time base of the audio data. The exemplary decoder comprises a first decoder portion for detecting the substantially single-frequency components of the message symbols, and a second decoder portion for detecting the message symbols based on the detected substantially single-frequency components thereof, wherein the detection is based at least in part on a synchronization of the message symbols between the two encoded layers. The decoder may further comprise a decoder portion configured to perform error correction on at least some of the detected message symbols, wherein the error correction comprises a Reed-Solomon error correction or a convolutional code error correction.

BRIEF DESCRIPTION OF THE DRAWINGS

The present invention is illustrated by way of example and not limitation in the figures of the accompanying drawings, in which like references indicate similar elements and in which:

FIGS. 8 and 8A are exemplary message structures for arranging codes among merged layers to obtain supplemental information under one embodiment;

FIG. 12 is an exemplary embodiment for performing error correction on an encoded audio signal;

FIG. 15 is an exemplary flow diagram for executing a decoder application on a processing device under one embodiment.

DETAILED DESCRIPTION

A mobile terminal as used herein comprises at least one wireless communications transceiver. Non-limiting examples of the transceivers include a GSM (Global System for Mobile Communications) transceiver, a GPRS (General Packet Radio Service) transceiver, an EDGE (Enhanced Data rates for Global Evolution) transceiver, a UMTS (Universal Mobile Telecommunications System) transceiver, a WCDMA (wideband code division multiple access) transceiver, a PDC (Personal Digital Cellular) transceiver, a PHS (Personal Handy-phone System) transceiver, and a WLAN (Wireless LAN, wireless local area network) transceiver. The transceiver may be such that it is configured to co-operate with a predetermined communications network (infrastructure), such as the transceivers listed above. The network may further connect to other networks and provide versatile switching means for establishing circuit switched and/or packet switched connections between the two end points. Additionally, the device may include a wireless transceiver such as a Bluetooth adapter meant for peer-to-peer communication and piconet/scatternet use. Furthermore, the terminal may include interface(s) for wired connections and associated communication relative to external entities, such as an USB (Universal Serial Bus) interface or a Firewire interface.

Figure 1:
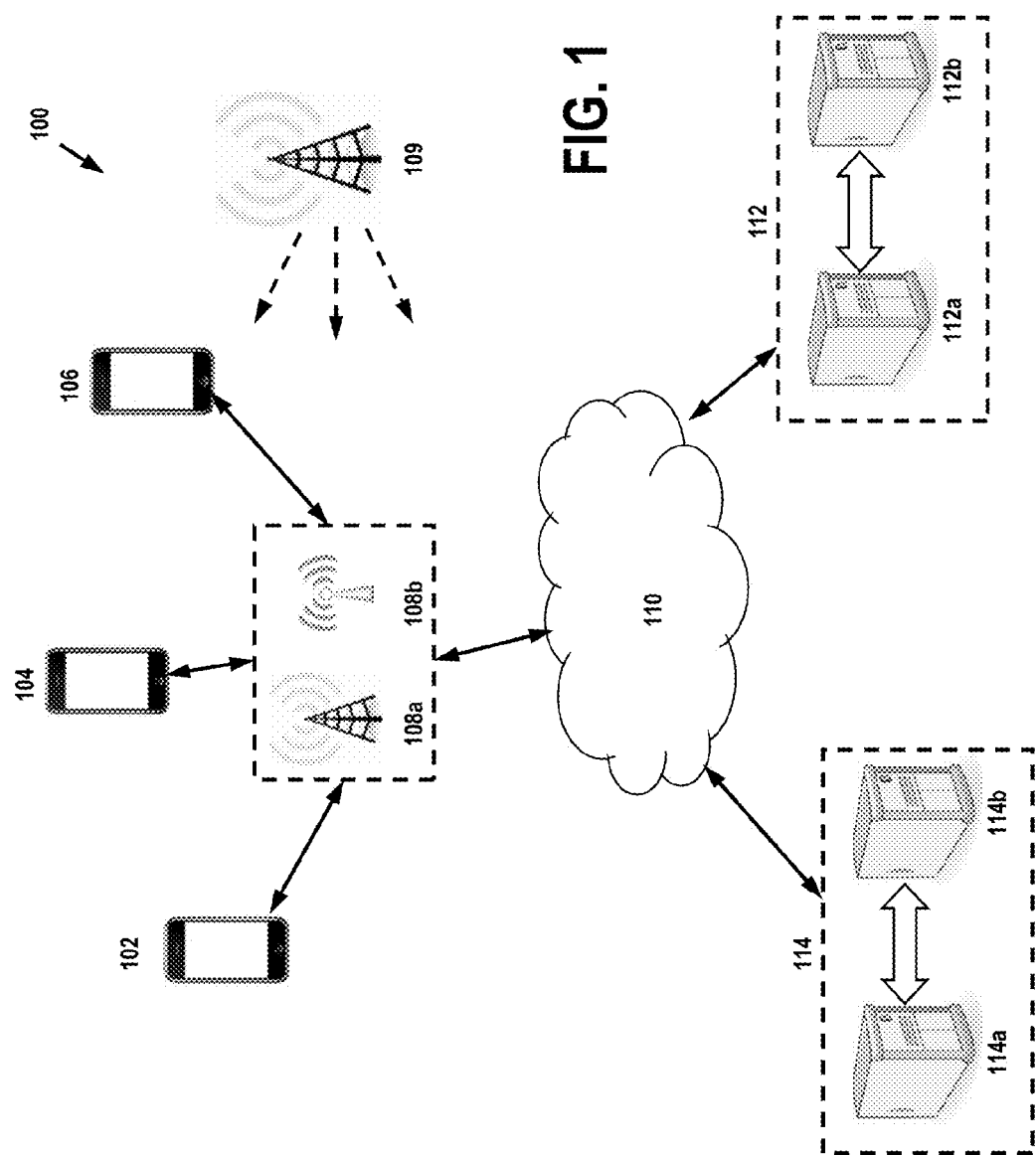
FIG. 1 is an exemplary system diagram illustrating communication among mobile terminals to a computer network that is communicatively coupled to at least one server arrangement and external entities.

Turning to FIG. 1, an exemplary system architecture is illustrated. The exemplary system comprises an audio monitoring part executed in one or more terminals, or portable computing devices 102, 104, 106 of respective users and a server arrangement part 112 comprising one or more server devices (112a, 112b) functionally arranged so as to establish a media server entity. Devices 102-106 may also receive (or be in the vicinity of) broadcast media and the like from one or more broadcast sources 109. Devices 102-106 are configured to monitor audio media exposure relating to their respective users in accordance with the principles set forth herein. Server 112 is typically connected to a communications network 110 whereto also the mobile terminals 102, 104, 106 are provided with access, e.g. via one or more access networks 108a, 108b, which may be cellular, wired or wireless local area networks, for instance. External entities 114 such as services/servers (114a, 114b) may be connected to the server arrangement 112 via the network 110 for obtaining, storing and processing audio code data received from devices 102-106 and related data derived therefrom and/or for providing supplementary data.

Figure 2:
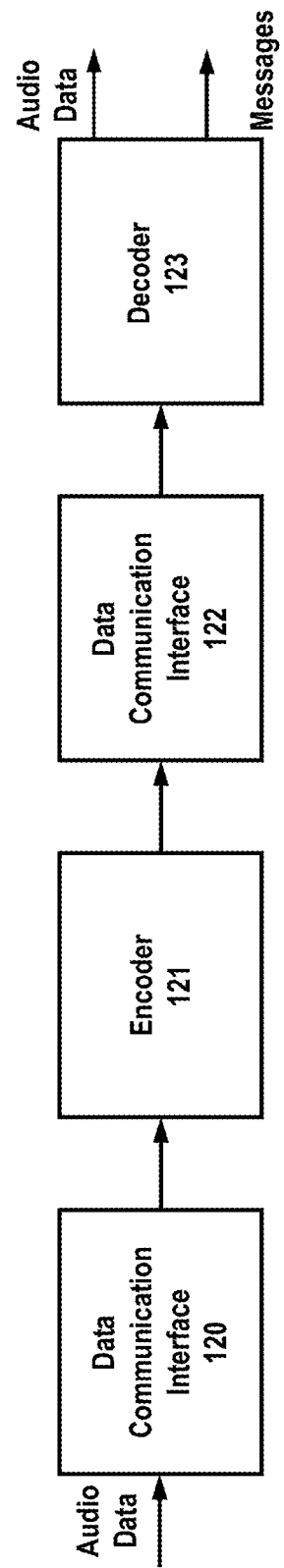
FIG. 2 is a functional block diagram of a communications system incorporating an encoder and decoder in accordance with certain exemplary embodiments.

FIG. 2 is an overview of encoding and decoding processes and systems in accordance with certain embodiments. The audio data represented in FIG. 2 can come in many forms. The audio data can be in a compressed or uncompressed format. The audio data can be previously encoded or unencoded. The audio data can be represented in the time domain or the frequency domain. The audio data can also have any combination of the foregoing audio data forms. Audio data, regardless of its form as described above, enters the system through a communications interface 120. This communications interface 120 utilizes any of the readily available technologies such as a serial port, parallel port, coaxial cable, twisted wire, infrared port, optical cable, microwave link, RF, wireless port, satellite link or the like.

The audio data then enters encoder 121 from communications interface 120. In encoder 121, in one mode of operation the audio data is encoded with multiple messages that share substantially single-frequency components. In another, the audio data as received by encoder 121 has a message encoded therein and encoder 121 encodes one or more additional messages in the audio data. The encoded audio data is then communicated via a communication interface 122. The communication interface 122 can come in any of multiple forms such as radio broadcasts, television broadcasts, DVDs, MP3s, compact discs, streaming music, streaming video, network data, mini-discs, multimedia presentations, personal address systems or the like. Decoder 123 then receives the communicated encoded audio data. Decoder 123 may be embodied as part of a receiver, a personal people meter, a computer device, or portable processing device, discussed in further detail below.

Decoder 123 is configured to detect encoded messages. As a result of the ability to retrieve the encoded messages, decoder 123 can therefore possess a myriad of functionality such as the relaying of information, e.g. providing the performing artist's name or providing audience estimating information, or controlling access, e.g. an encryption key scheme, or data transport, e.g. using the encoded messages as an alternate communications channel. Decoder 123 can possess the ability to reproduce the audio data but this is not essential. For example, a decoder 123 used for gathering audience estimate data can receive the audio data in acoustic form, in electrical form or otherwise from a separate receiver. In the case of an encryption key scheme, the reproduction of the audio data for an encryption key holder is the objective.

Figure 3:
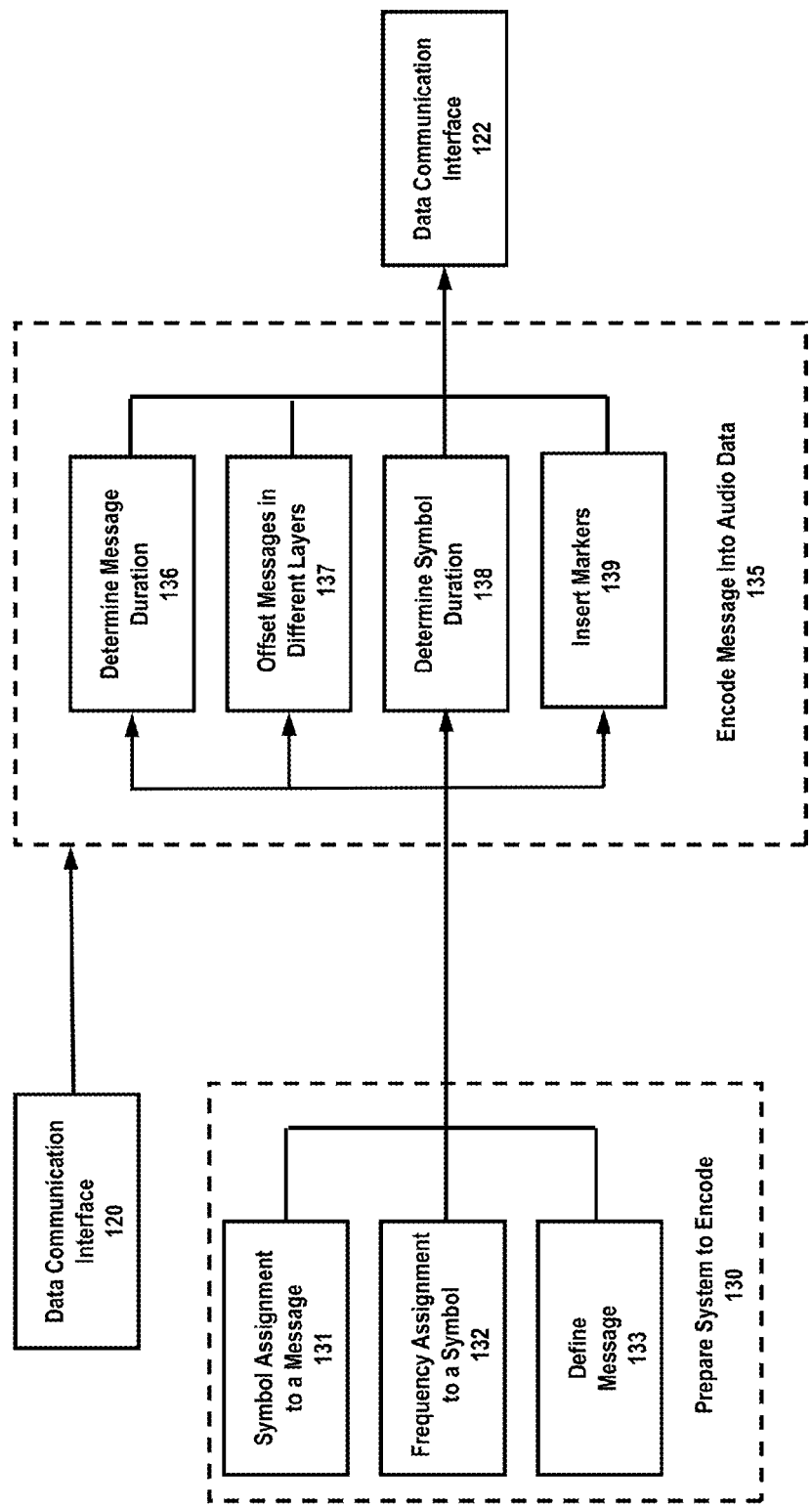
FIG. 3 is an overview of an encoding process in accordance with certain embodiments of the present invention.

FIG. 3 is an overview of encoding processes and systems according to certain embodiments of the invention. Block 130 illustrates a number of preferred preliminary operations 131-133 which are carried out in preparation for encoding one or more messages into audio data. As indicated by operation 133, the content of a message to be encoded is defined. In certain embodiments this is achieved by selecting from a plurality of predefined messages, while in others the content of the message is defined through a user input or by data received from a further system. In still others the identity of the message content is fixed. Once the content of the message is known, a sequence of symbols is assigned to represent the message as indicated at 131. The symbols are selected from a predefined set preferably comprising alphanumeric code symbols. In certain embodiments, the symbol sequences are pre-assigned to corresponding predefined messages. When a message to be encoded is fixed, as in a station ID message, operations 131 and 138 preferably are combined to define a single invariant message symbol sequence.

Operation 132 may be configured to assign a plurality of substantially single-frequency code components to each of the message symbols. When the message is encoded, each symbol of the message is represented in the audio data by its corresponding plurality of substantially single-frequency code components. Each of such code components preferably occupies only a narrow frequency band so that it may be distinguished from other such components as well as noise with a sufficiently low probability of error. It is recognized that the ability of an encoder or decoder to establish or resolve data in the frequency domain is limited, so that the substantially single-frequency components are represented by data within some finite or narrow frequency band. Moreover, there are circumstances in which is advantageous to regard data within a plurality of frequency bands as corresponding to a substantially single-frequency component. This technique is useful where, for example, the component may be found in any of several adjacent bands due to frequency drift, variations in the speed of a tape or disk drive, or even as the result of an incidental or intentional frequency variation inherent in the design of a system.

Once block 130 prepares symbols for encoding, they may be arranged as messages that may be separately or simultaneously embedded into audio using multiple layers. Some exemplary processes for embedding such messages is described in U.S. Pat. No. 6,845,360, titled "Encoding Multiple Messages In Audio Data and Detecting Same," which is assigned to the assignee of the present application and is incorporated by reference in its entirety herein. In certain embodiments, several message parameters may be selected singly or in combination in order to ensure that the first and second messages can be separately decoded. Block 135 represents multiple operations which serve to determine parameters of the message to be encoded either to distinguish it from a message previously encoded in the audio data or from one or more further messages also being encoded therein at the same time. One such parameter is the symbol interval, selected in operation 138 of FIG. 2. In certain embodiments, the intervals of symbols within one or both messages can be separate or overlap to provide even greater bandwidth.

Operation 137 of FIG. 3 provides the ability to introduce an offset between messages to assist in distinguishing them especially in those embodiments in which the message durations and/or symbol intervals are the same. Although not required in all applications, messages may include a marker symbol which may have a fixed position in the message regardless of its informational content and is included through operation 139 in FIG. 2. Such a configuration enables the decoder 123 of FIG. 1 to determine the times of occurrence of each of the symbols. The marker symbol, like the other symbols, comprises a combination of substantially single-frequency values selected from the predefined set thereof. Because the offset between messages is fixed and known, it may be used along with the marker symbol by the decoder 123 in this example to locate the message symbols along the time base and detect them. In certain embodiments the offset is used without reference to a marker symbol to separately detect the first and second messages. Operation 136 of FIG. 3 determines the duration of each of the messages, either in cooperation with operations 131 and 138 or by inserting padding data, as appropriate. Exemplary message structures, along with variant message structures, are provided in connection with FIGS. 7 and 8, which are discussed in greater detail below.

Figure 4:
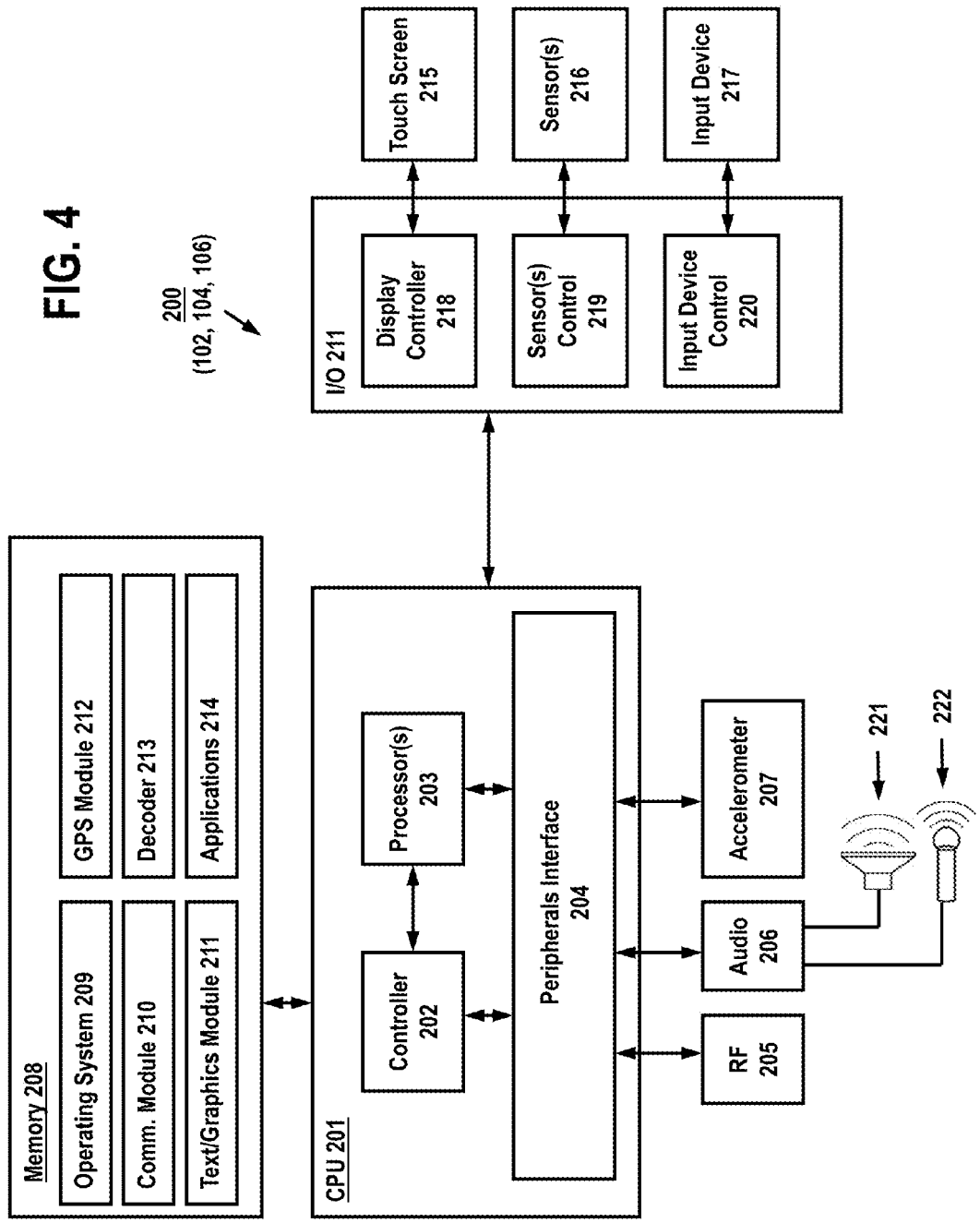
FIG. 4 is an exemplary mobile terminal portable computing device configured to provide monitoring capabilities on a device.

FIG. 4 is an exemplary embodiment of a portable computing device 200 which may function as a terminal (see references 102, 104 and 106 of FIG. 1), and may be a smart phone, tablet computer, laptop or the like. Device 200 may include a central processing unit (CPU) 201 (which may include one or more computer readable storage mediums), a memory controller 202, one or more processors 203, a peripherals interface 204, RF circuitry 205, audio circuitry 206, a speaker 220, a microphone 220, and an input/output (I/O) subsystem 211 having display controller 212, control circuitry for one or more sensors 213 and input device control 214. These components may communicate over one or more communication buses or signal lines in device 200. It should be appreciated that device 200 is only one example of a portable multifunction device 200, and that device 200 may have more or fewer components than shown, may combine two or more components, or a may have a different configuration or arrangement of the components. The various components shown in FIG. 2 may be implemented in hardware or a combination of hardware and software, including one or more signal processing and/or application specific integrated circuits.

In one example, decoder 213 may be configured as software tangibly embodied in memory 208, which may communicate with other software in memory 208 and CPU 201, as well as audio circuitry 206, and serves to decode ancillary data embedded in audio signals in order to detect exposure to media. Examples of techniques for encoding and decoding such ancillary data are disclosed in U.S. Pat. No. 6,871,180, titled "Decoding of Information in Audio Signals," issued Mar. 22, 2005, and are incorporated by reference in its entirety herein. Other suitable techniques for encoding data in audio data are disclosed in U.S. Pat. No. 7,640,141 to Ronald S. Kolessar and U.S. Pat. No. 5,764,763 to James M. Jensen, et al., which are incorporated by reference in their entirety herein. Other appropriate encoding techniques are disclosed in U.S. Pat. No. 5,579,124 to Aijala, et al., U.S. Pat. Nos. 5,574,962, 5,581,800 and 5,787,334 to Fardeau, et al., and U.S. Pat. No. 5,450,490 to Jensen, et al., each of which is assigned to the assignee of the present application and all of which are incorporated herein by reference in their entirety.

An audio signal which may be encoded with a plurality of code symbols may be received via data communication through RF interface 205 via audio circuitry 206, or through any other data interface allowing for the receipt of audio/visual data in digital form. Audio signals may also be received via microphone 222. Furthermore, encoded audio signals may be reproduced on device 200 through digital files stored in memory 208 and executed through one or more applications (214) stored in memory 208 such as a media player that is linked to audio circuitry 206. From the following description in connection with the accompanying drawings, it will be appreciated that decoder 213 is capable of detecting codes in addition to those arranged in the formats disclosed hereinabove. Memory 208 may also include high-speed random access memory (RAM) and may also include non-volatile memory, such as one or more magnetic disk storage devices, flash memory devices, or other non-volatile solid-state memory devices. Access to memory 208 by other components of the device 200, such as processor 203, decoder 213 and peripherals interface 204, may be controlled by the memory controller 202. Peripherals interface 204 couples the input and output peripherals of the device to the processor 203 and memory 208. The one or more processors 203 run or execute various software programs and/or sets of instructions stored in memory 208 to perform various functions for the device 200 and to process data. In some embodiments, the peripherals interface 204, processor(s) 203, decoder 213 and memory controller 202 may be implemented on a single chip, such as a chip 201. In some other embodiments, they may be implemented on separate chips.

The RF (radio frequency) circuitry 205 receives and sends RF signals, also known as electromagnetic signals. The RF circuitry 205 converts electrical signals to/from electromagnetic signals and communicates with communications networks and other communications devices via the electromagnetic signals. The RF circuitry 205 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 205 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a plurality of communications standards, protocols and technologies, including but not limited to Global System for Mobile Communications (GSM), Enhanced Data GSM Environment (EDGE), high-speed downlink packet access (HSDPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for email (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), and/or Instant Messaging and Presence Service (IMPS)), and/or Short Message Service (SMS)), or any other suitable communication protocol, including communication protocols not yet developed as of the filing date of this document.

Audio circuitry 206, speaker 221, and microphone 222 provide an audio interface between a user and the device 200. Audio circuitry 206 may receive audio data from the peripherals interface 204, converts the audio data to an electrical signal, and transmits the electrical signal to speaker 221. The speaker 221 converts the electrical signal to human-audible sound waves. Audio circuitry 206 also receives electrical signals converted by the microphone 221 from sound waves, which may include encoded audio, described above. The audio circuitry 206 converts the electrical signal to audio data and transmits the audio data to the peripherals interface 204 for processing. Audio data may be retrieved from and/or transmitted to memory 208 and/or the RF circuitry 205 by peripherals interface 204. In some embodiments, audio circuitry 206 also includes a headset jack for providing an interface between the audio circuitry 206 and removable audio input/output peripherals, such as output-only headphones or a headset with both output (e.g., a headphone for one or both ears) and input (e.g., a microphone).

I/O subsystem 211 couples input/output peripherals on the device 200, such as touch screen 215 and other input/control devices 217, to the peripherals interface 204. The I/O subsystem 211 may include a display controller 218 and one or more input controllers 220 for other input or control devices. The one or more input controllers 220 receive/send electrical signals from/to other input or control devices 217. The other input/control devices 217 may include physical buttons (e.g., push buttons, rocker buttons, etc.), dials, slider switches, joysticks, click wheels, and so forth. In some alternate embodiments, input controller(s) 220 may be coupled to any (or none) of the following: a keyboard, infrared port, USB port, and a pointer device such as a mouse, an up/down button for volume control of the speaker 221 and/or the microphone 222. Touch screen 215 may also be used to implement virtual or soft buttons and one or more soft keyboards.

Touch screen 215 provides an input interface and an output interface between the device and a user. The display controller 218 receives and/or sends electrical signals from/to the touch screen 215. Touch screen 215 displays visual output to the user. The visual output may include graphics, text, icons, video, and any combination thereof (collectively termed "graphics"). In some embodiments, some or all of the visual output may correspond to user-interface objects. Touch screen 215 has a touch-sensitive surface, sensor or set of sensors that accepts input from the user based on haptic and/or tactile contact. Touch screen 215 and display controller 218 (along with any associated modules and/or sets of instructions in memory 208) detect contact (and any movement or breaking of the contact) on the touch screen 215 and converts the detected contact into interaction with user-interface objects (e.g., one or more soft keys, icons, web pages or images) that are displayed on the touch screen. In an exemplary embodiment, a point of contact between a touch screen 215 and the user corresponds to a finger of the user. Touch screen 215 may use LCD (liquid crystal display) technology, or LPD (light emitting polymer display) technology, although other display technologies may be used in other embodiments. Touch screen 215 and display controller 218 may detect contact and any movement or breaking thereof using any of a plurality of touch sensing technologies now known or later developed, including but not limited to capacitive, resistive, infrared, and surface acoustic wave technologies, as well as other proximity sensor arrays or other elements for determining one or more points of contact with a touch screen 215.

Device 200 may also include one or more sensors 216 such as optical sensors that comprise charge-coupled device (CCD) or complementary metal-oxide semiconductor (CMOS) phototransistors. The optical sensor may capture still images or video, where the sensor is operated in conjunction with touch screen display 215. Device 200 may also include one or more accelerometers 207, which may be operatively coupled to peripherals interface 204. Alternately, the accelerometer 207 may be coupled to an input controller 214 in the I/O subsystem 211. The accelerometer is preferably configured to output accelerometer data in the x, y, and z axes.

In some embodiments, the software components stored in memory 208 may include an operating system 209, a communication module 210, a text/graphics module 211, a Global Positioning System (GPS) module 212, audio decoder 213 and applications 214. Operating system 209 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components. Communication module 210 facilitates communication with other devices over one or more external ports and also includes various software components for handling data received by the RF circuitry 205. An external port (e.g., Universal Serial Bus (USB), Firewire, etc.) may be provided and adapted for coupling directly to other devices or indirectly over a network (e.g., the Internet, wireless LAN, etc.

Text/graphics module 211 includes various known software components for rendering and displaying graphics on the touch screen 215, including components for changing the intensity of graphics that are displayed. As used herein, the term "graphics" includes any object that can be displayed to a user, including without limitation text, web pages, icons (such as user-interface objects including soft keys), digital images, videos, animations and the like. Additionally, soft keyboards may be provided for entering text in various applications requiring text input. GPS module 212 determines the location of the device and provides this information for use in various applications. Applications 214 may include various modules, including address books/contact list, email, instant messaging, video conferencing, media player, widgets, instant messaging, camera/image management, and the like. Examples of other applications include word processing applications, JAVA-enabled applications, encryption, digital rights management, voice recognition, and voice replication.

Returning briefly to the example of FIG. 1, user devices 102-106 may receive media received from a media source 112, which preferably provides network-based media, such as streaming media or digital media files. Media source 112 may comprise one or more servers (102a, 102b) communicatively linked to network 110, which may provide media to devices 102-105 via wired, wireless (108b) and/or cellular (108a) communication. It is understood that other media formats are possible in this disclosure as well (e.g., 109), including cable, satellite, distributed on storage media, or by any other means or technique that is humanly perceptible, without regard to the form or content of such data. As will be explained in further details below, device 200 receives encoded audio through a wired or wireless connection (e.g., 802.11g, 802.11n, Bluetooth, etc.). The encoded audio is natively decoded using decoding software 213. After the encoded audio is decoded, one or more messages are detected.

Figure 5:
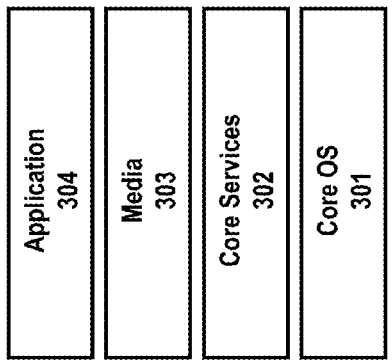
FIG. 5 is an exemplary software architecture for implementing a decoding application under one embodiment.

Turning to FIG. 5, an exemplary architecture for decoding audio is provided for software stored in memory 208. It should be understood by those skilled in the art that the software embodiments herein are merely exemplary, and that hardware (or combination of hardware/software) equivalents may be used as well. The embodiment of FIG. 5 is particularly advantageous in instances where a device receives and reproduces media containing audio. Other configurations, such as a device capturing ambient audio via a microphone, are contemplated in this disclosure as well. Preferably, for each of software 209-214, and particularly for audio decoder 213 are configured in the application layer 304, which sits at the top of the operating system stack and contains the frameworks that are most commonly used by the software. Application layer 304 is preferably configured under an Objective-C platform containing standard application interfaces (APIs) known in the art. Application layer 304 is configured to support multiple frameworks for allowing software to operate, including, but not limited to, a programming interface (e.g., Java, UIKit framework) for providing user interface management, application lifecycle management, application event handling, multitasking, data protection via encryption, data handling, inter-application integration, push notification, local notification, accessibility, and the like. Other frameworks known in the art may be utilized as well.

Media layer 303 may be configured to provide application layer 304 with audio, video, animation and graphics capabilities. As with the other layers comprising the stack of FIG. 3, the media layer comprises a number of frameworks that may be supported. In addition to frameworks for graphic and video support, media layer 303 may be configured to support an audio framework (Objective-C, Java) configured to allow the playback and management of audio content A core audio framework would be responsible for supporting various audio types, playback of audio files and streams and also provide access to device's 200 built-in audio processing units. A media player framework in media layer 303 would advantageously support the playing of movies, music, audio podcast, audio book files, streaming media, stored media library files, etc. at a variety of compression standards, resolutions and frame rates.

Core services layer 302 comprises fundamental system services that all applications use, and also provides interfaces that use object-oriented abstractions for working with network protocols and for providing control over protocols stack and provide simplified use of lower-level constructs such as BSD sockets. Functions of core services layer 302 provide simplified tasks such as communicating with FTP and HTTP servers or resolving DNS hosts. Core OS layer 301 is the deepest layer of the architecture of FIG. 3 and provides an interface between existing hardware and system frameworks. Core OS Layer 301 comprises the kernel environment, drivers, and basic interfaces of the operating system. Many functions including virtual memory system, threads, file system, network, and inter-process communication is managed by the kernel. It should be understood by those skilled in the art that the embodiment of FIG. 5 describes a software architecture based on multiple abstraction layers (e.g., iOS). Other suitable architectures incorporating media players and audio reproduction are contemplated as well. As one example, the software architecture may be based on a Linux kernel comprising middleware, libraries and APIs written in C, and application software running on an application framework which includes Java-compatible libraries based on Apache Harmony and the like.

Figure 6:
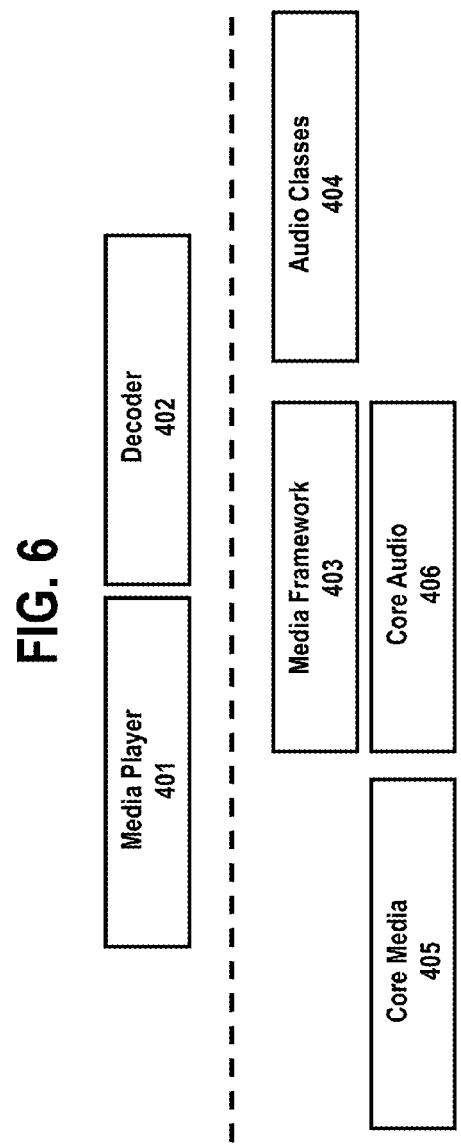
FIG. 6 is an exemplary framework for media reproduction and decoding under one embodiment.

Turning to FIG. 6, an exemplary embodiment is provided of a media reproduction software architecture that may be utilized in any of the embodiments described above. In this example, media player 401 and audio decoder 402 are preferably configured in an application layer (304) for device 200, in which each is communicatively coupled to each other and to lower layer modules 403-406 (shown separated by the dashed line in FIG. 4). Media player 401 may be configured to control playback of audio/visual (A/V) media locally using media framework 403, subject to audio classes 404 defined for the player (e.g., AVAudioPlayer). A device may also play A/V media via embedded web content classes (e.g. UIWebView, QT WebView) or play HTTP live streams by initializing an instance of a media player item (e.g., AVPlayerItem) using a URL. Primitive data structures for media framework 403, including time-related data structures and opaque objects to carry and describe media data may be defined in core media framework 405. Supported audio types, playback and recording of audio files and streams may be defined in core audio 406 and may also provide access to the device's built-in audio processing units.

During one exemplary mode of operation, which will be discussed in greater detail below, the audio portion of media played using media player 401 is stored and/or forwarded to decoder application 402. Using one or more techniques described herein below, decoder 402 processes the audio portion to detect if ancillary codes are present within the audio. If present, the ancillary codes are read, stored, and ultimately transmitted to a remote or central location (114) where the codes may be further processed to determine characteristics (e.g., identification, origin, etc.) of the media and further determine media exposure for a user associated with a device (200) for audience measurement purposes.

Figure 7:
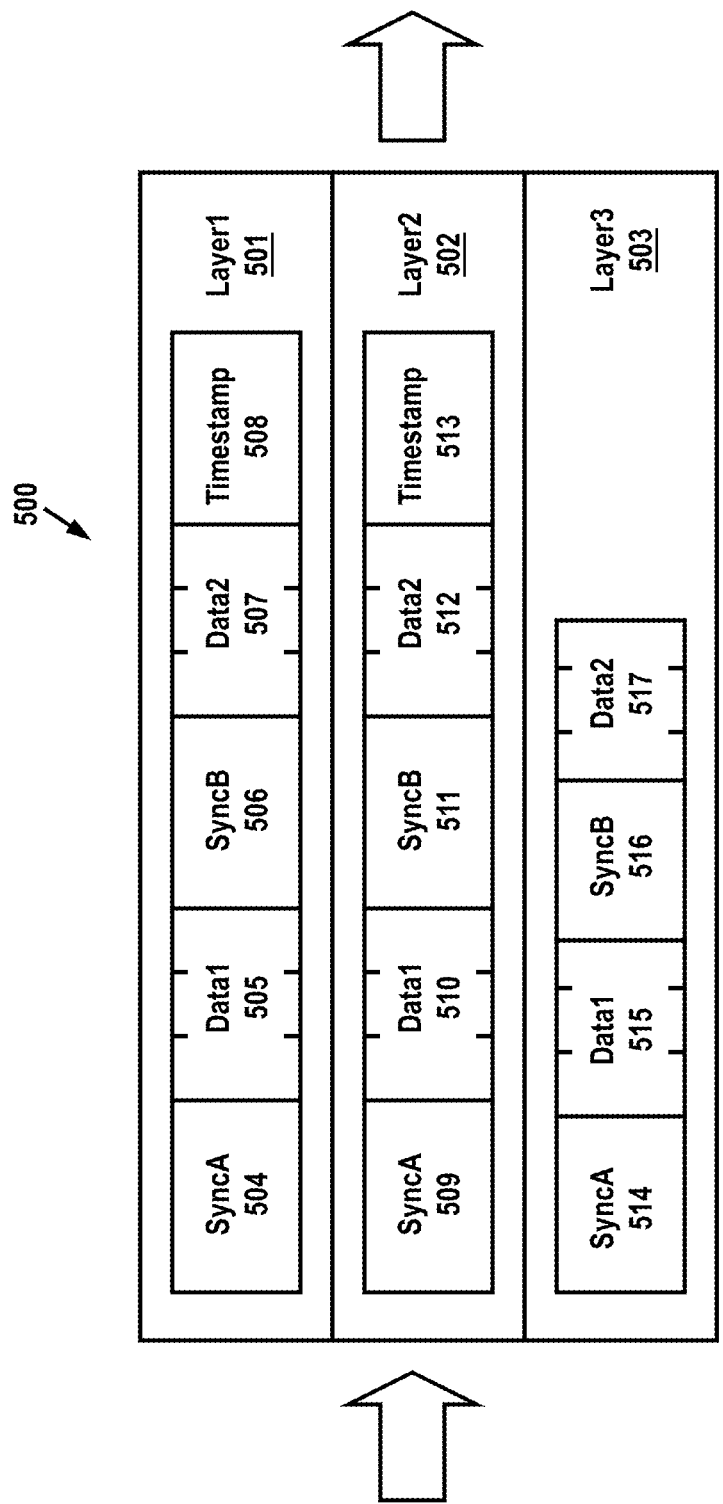
FIG. 7 is an exemplary message structure for ancillary codes and/or messages that may be suitable for obtaining supplemental information.

With regard to encoding/decoding audio, FIG. 7 illustrates a message 500 that may be embedded/encoded into an audio signal. In this embodiment, message 500 includes three or more layers that are inserted by encoders in a parallel format. Suitable encoding techniques are disclosed in U.S. Pat. No. 6,871,180, titled "Decoding of Information in Audio Signals," issued Mar. 22, 2005 and U.S. Pat. No. 6,845,360 titled "Encoding Multiple Messages in Audio Data and Detecting Same," which are assigned to the assignee of the present application, and are incorporated by reference in its entirety herein. Other suitable techniques for encoding data in audio data are disclosed in U.S. Pat. No. 7,640,141 to Ronald S. Kolessar and U.S. Pat. No. 5,764,763 to James M. Jensen, et al., which are also assigned to the assignee of the present application, and which are incorporated by reference in their entirety herein. Other appropriate encoding techniques are disclosed in U.S. Pat. No. 5,579,124 to Aijala, et al., U.S. Pat. Nos. 5,574,962, 5,581,800 and 5,787,334 to Fardeau, et al., and U.S. Pat. No. 5,450,490 to Jensen, et al., each of which is assigned to the assignee of the present application and all of which are incorporated herein by reference in their entirety.

When utilizing a multi-layered message, a plurality of layers may be present in an encoded data stream, and each layer may be used to convey different data. Turning to FIG. 7, message 500 includes a first layer 501 containing a message comprising multiple message symbols. During the encoding process, a predefined set of audio tones (e.g., ten) or single frequency code components are added to the audio signal during a time slot for a respective message symbol. At the end of each message symbol time slot, a new set of code components is added to the audio signal to represent a new message symbol in the next message symbol time slot. At the end of such new time slot another set of code components may be added to the audio signal to represent still another message symbol, and so on during portions of the audio signal that are able to psychoacoustically mask the code components so they are inaudible. Preferably, the symbols of each message layer are selected from a unique symbol set. In layer 501, each symbol set includes two synchronization symbols (also referred to as marker symbols) 504, 506, a larger number of data symbols 505, 507, and time code symbols 508. Time code symbols 508 and data symbols 905, 907 are preferably configured as multiple-symbol groups.

The second layer 502 of message 500 is illustrated having a similar configuration to layer 501, where each symbol set includes two synchronization symbols 509, 511, a larger number of data symbols 510, 512, and time code symbols 513. The third layer 503 includes two synchronization symbols 514, 516, and a larger number of data symbols 515, 517. The data symbols in each symbol set for the layers (501-503) should preferably have a predefined order and be indexed (e.g., 1, 2, 3). The code components of each symbol in any of the symbol sets should preferably have selected frequencies that are different from the code components of every other symbol in the same symbol set. Under one embodiment, none of the code component frequencies used in representing the symbols of a message in one layer (e.g., Layer1 501) is used to represent any symbol of another layer (e.g., Layer2 502). In another embodiment, some of the code component frequencies used in representing symbols of messages in one layer (e.g., Layer3 503) may be used in representing symbols of messages in another layer (e.g., Layer1 501). However, in this embodiment, it is preferable that "shared" layers have differing formats (e.g., Layer3 503, Layer1 501) in order to assist the decoder in separately decoding the data contained therein.

Sequences of data symbols within a given layer are preferably configured so that each sequence is paired with the other and is separated by a predetermined offset. Thus, as an example, if data 905 contains code 1, 2, 3 having an offset of "2", data 507 in layer 501 would be 3, 4, 5. Since the same information is represented by two different data symbols that are separated in time and have different frequency components (frequency content), the message may be diverse in both time and frequency. Such a configuration is particularly advantageous where interference would otherwise render data symbols undetectable. Under one embodiment, each of the symbols in a layer have a duration (e.g., 0.2-0.8 sec) that matches other layers (e.g., Layer1 501, Layer2 502). In another embodiment, the symbol duration may be different (e.g., Layer 2 502, Layer 3 503). During a decoding process, the decoder detects the layers and reports any predetermined segment that contains a code.

Figure 8:
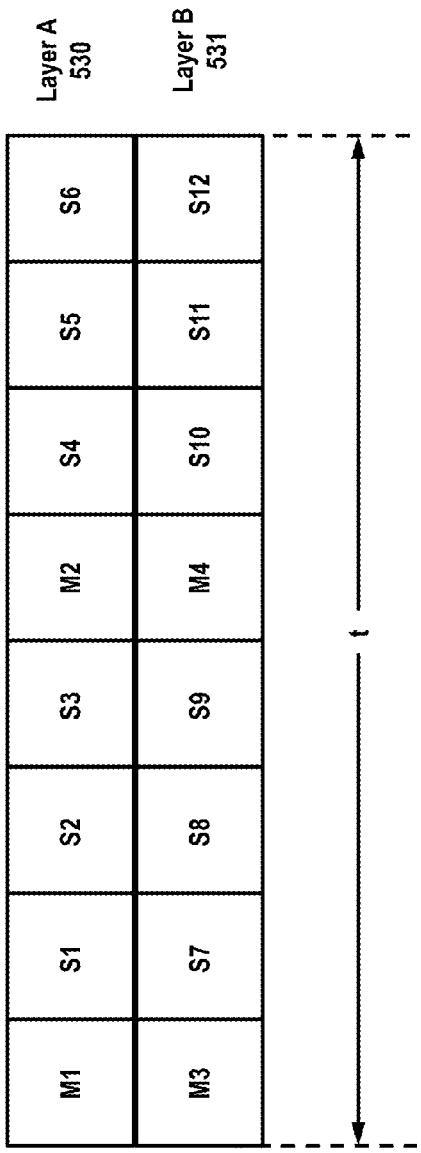

FIG. 8 illustrates another message structure, in which message layers may be "folded" onto each other to create what is, in effect, a single, synchronized, merged layer. Since a typical message symbol unit may be comprised of a set of N specific discrete frequency bins, a set of K associated symbol units can be assembled and merged so that none of the K symbol units share frequency bins. The merged layer may comprise N*K frequency bins. Thus, as an example, assuming an encoding bandwidth of 2000 Hertz, if 10 frequency bins (N) are used for 18 symbol units (K), the merged layer would be made up of 180*3.96025=703.125 Hertz of the total selected bandwidth. By properly selecting the frequencies of the symbol units, different layers in the merged layer may be formed sharing from 0 to the 180 total bins of a given reference layer. For example, using the exemplary configuration of FIG. 7, Layer 1 501 may share 0 bins with the Layer 2 502, but, while Layer 3 503 may share bins with both Layer 1 and Layer 2. In another example, Layers 1 and 2 could have been selected to share the same 180 bins as long as the symbol units were selected properly to minimize symbol similarity.

The merged layer may be thought of as a process for encoding different layers of information at different point in the total audio chain such that multiple different message elements can be distinguished through detection observations. In certain (non-merged) applications, different code layers for audio are encoded at different physical locations (e.g., national broadcaster, local broadcaster, commercial distribution center, etc.) at different times. Since the encoding sites/locations may be widely separated in both time and location, the encoding of the layers is inherently asynchronous: messages on different layers have no set time relationship. By merging or "folding" the layers, multiple layers of information are permitted to exist; instead of using multiple different layers encoded at different points in the total audio chain to convey different message attributes (e.g., station identification), multiple different layers of information are combined in a time synchronous manner to create a message attribute or unified information set in one layer. Also, since the merged layer provides a more diverse platform for inserting codes, the numbers of different codes that may be used expand from tens of thousands of codes to billions. Such a configuration is particularly advantageous for use in non-linear media measurement and "on-demand" media.

In one embodiment, the merged or "folded" layers may comprise one layer similar to Layer 3 503 of FIG. 7, illustrated as Layer A 530 in FIG. 8, together with a merging layer (Layer B) 531. The message structure of Layer 3 503 is retained in Layer A for this example, except that the synchronization (or marker) symbols are replaced by checksums to allow error detection and correction across both portions of the merged message. The message duration may be a few seconds (e.g., 2-6 seconds) with a plurality of symbols (e.g., 8 symbols) each having a duration of milliseconds (e.g., 200-400 milliseconds). In one exemplary embodiment, no timestamp information is used. In another embodiment, a time synchronous layer (e.g., Layer 2 and/or Layer 1) may be used to further expand the number of available codes. Such a configuration is particularly advantageous for on-demand media. Since the message duration of the additional layers (501, 502) is typically longer, additional or duplicate messages may be encoded in these layers. It should be understood by those skilled in the art that, while the present disclosure discusses the merging or "folding" of two layers, further additional layers may be merged as well. The merging of multiple layers offers a number of advantages over conventional encoding/decoding systems, including:

- The ability to simultaneously encode/decode multiple layers of information uses the same input processes up through the computationally expensive FFTs. This makes the encoding process more efficient.
- The simultaneous encoding of multiple layers of information is more inaudible than serial encoding since prior layer artifacts may be totally removed.
- Marker redundancy can be reduced allowing more symbols to be dedicated to data and error correction.
- The total number of available identification or characteristic codes can be greatly increased.
- Allows cross folded layer error detection and correction which improves the detection process through the reduction of false positives and erroneous detections.

In the simplified embodiment of FIG. 8, Layer A 530, which may be a content layer, comprises message symbols S1-S3 and S4-S6, together with their respective marker symbols M1 and M2 and offset (offset1). Merging Layer B 531 comprises message symbols S7-S9 and S10-S12, together with respective checksums M3 and M4 and offset (offset2). During an encoding process the messages are structured such that $$(S4,S5,S6)=(S1,S2,S3)+\text{offset1}$$

and $$(S10,S11,S12)=(S7,S8,S9)+\text{offset2}$$

where,
M1=marker1 (covering 17 data symbols),
and
M2=marker 2 (covering 16 data symbols).
For encoding of checksums M3 and M4, the messages are structured such that $$\text{Checksum1}=S1+S2+S3(\text{modulo }16)$$

and $$\text{Checksum2}=S7+S8+S9(\text{modulo }16)$$

where,
M3=Checksum1+Checksum2(modulo 16),
and
M4=Checksum1−Checksum2(modulo 16).

Turning to FIG. 8A, another simplified example is provided using the structure of FIG. 8, where message "12345678" is to be encoded into a merged layer (Layer A+Layer B). As can be seen from the figure, symbols S1-S3 and S4-S6 (of Layer A) are respectively assigned the "1-3" and "5-7" portions of the message, where the "4" is reserved for checksum (M4). Symbols S7-S9 and S10-S12 (of Layer B) are respectively assigned "5-7" and "D-F" (Hex), where "8" is reserved for checksum (M3). As only two markers are needed for the merged layers in this example, marker symbol M1 represents 17 data symbols (16 data symbols+1 marker) and M2 represents 16 data symbols. By arranging the layers in this manner using the checksums, it can be appreciated that the message data may be effectively shared between the merged layers.

Figure 9:
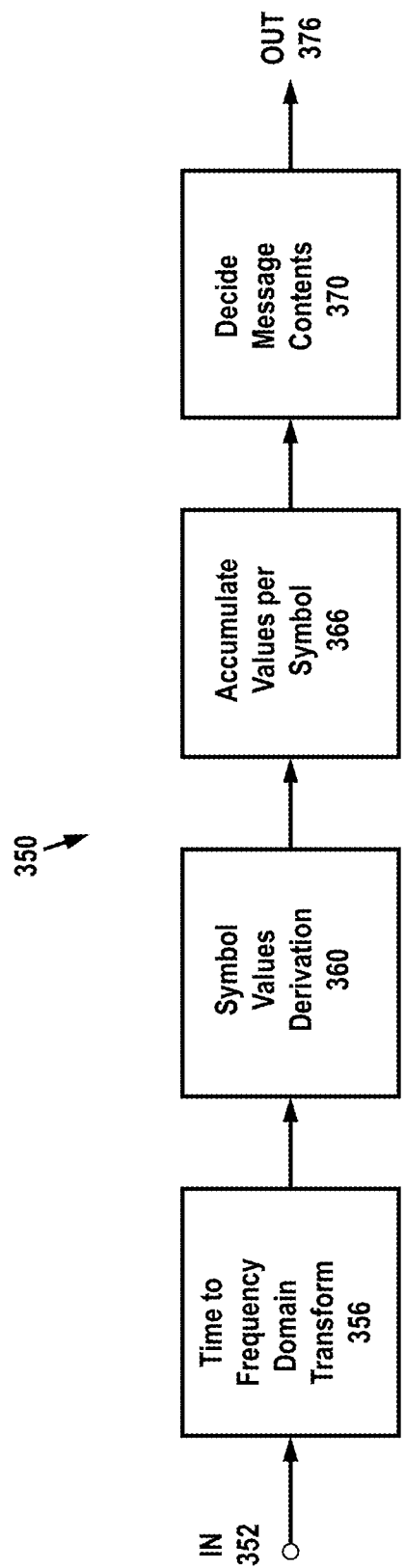
FIG. 9 illustrates an exemplary decoding process under one embodiment.

FIG. 9 is a functional block diagram illustrating a decoding algorithm under one embodiment. An audio signal which may be encoded as described herein with a plurality of code symbols is received at a digital input 352. The received audio signal may be from streaming media, otherwise communicated signal, or a signal reproduced from storage in a device. It may be a direct-coupled or an acoustically coupled signal. From the following description in connection with the accompanying drawings, it will be appreciated that decoder 350 is capable of detecting codes in addition to those arranged in the formats disclosed herein.

For received audio signals in the time domain, decoder 350 transforms such signals to the frequency domain by means of function 356. Function 356 preferably is performed by a digital processor implementing a fast Fourier transform (FFT) although a direct cosine transform, a chirp transform or a Winograd transform algorithm (WFTA) may be employed in the alternative. Any other time-to-frequency-domain transformation function providing the necessary resolution may be employed in place of these. It will be appreciated that in certain implementations, function 356 may also be carried out by filters, by an application specific integrated circuit, or any other suitable device or combination of devices. Function 356 may also be implemented by one or more devices which also implement one or more of the remaining functions illustrated in FIG. 9.

The frequency domain-converted audio signals are processed in a symbol values derivation function 360, to produce a stream of symbol values for each code symbol included in the received audio signal. The produced symbol values may represent, for example, signal energy, power, sound pressure level, amplitude, etc., measured instantaneously or over a period of time, on an absolute or relative scale, and may be expressed as a single value or as multiple values. Where the symbols are encoded as groups of single frequency components each having a predetermined frequency, the symbol values preferably represent either single frequency component values or one or more values based on single frequency component values. Function 360 may be carried out by a digital processor, which advantageously carries out some or all of the other functions of decoder 350. However, the function 360 may also be carried out by an application specific integrated circuit, or by any other suitable device or combination of devices, and may be implemented by apparatus apart from the means which implement the remaining functions of the decoder 350.

The stream of symbol values produced by the function 360 are accumulated over time in an appropriate storage device on a symbol-by-symbol basis, as indicated by function 366. In particular, function 366 is advantageous for use in decoding encoded symbols which repeat periodically, by periodically accumulating symbol values for the various possible symbols. For example, if a given symbol is expected to recur every X seconds, the function 366 may serve to store a stream of symbol values for a period of nX seconds (n>1), and add to the stored values of one or more symbol value streams of nX seconds duration, so that peak symbol values accumulate over time, improving the signal-to-noise ratio of the stored values. Function 366 may be carried out by a digital processor (or a DSP) which advantageously carries out some or all of the other functions of the decoder. However, the function 366 may also be carried out using a memory device separate from such a processor, or by an application specific integrated circuit, or by any other suitable device or combination of devices, and may be implemented by apparatus apart from the means which implements the remaining functions of the decoder 350.

The accumulated symbol values stored by the function 366 are then examined by the function 370 to detect the presence of an encoded message and output the detected message at an output 376. Function 370 can be carried out by matching the stored accumulated values or a processed version of such values, against stored patterns, whether by correlation or by another pattern matching technique. However, function 370 advantageously is carried out by examining peak accumulated symbol values, checksums and their relative timing, to reconstruct their encoded message from independent or merged layers. This function may be carried out after the first stream of symbol values has been stored by the function 366 and/or after each subsequent stream has been added thereto, so that the message is detected once the signal-to-noise ratios of the stored, accumulated streams of symbol values reveal a valid message pattern using the checksums.

Figure 10:
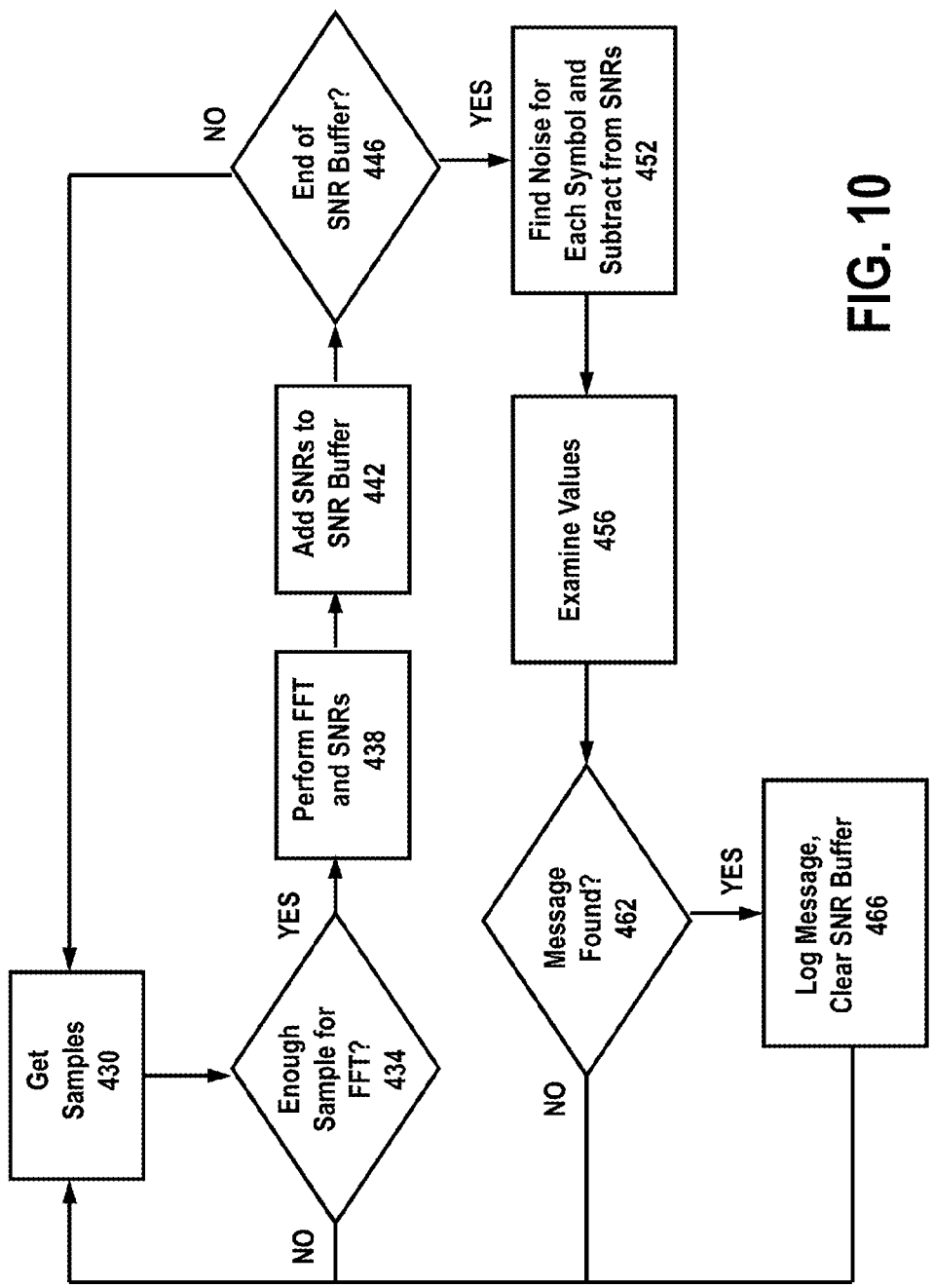
FIG. 10 is an exemplary flow chart illustrating a methodology for retrieving ancillary code from an encoded audio signal.

FIG. 10 is a flow chart for a decoder application according to one advantageous embodiment. Step 430 is provided for those applications in which the encoded audio signal is received in analog form, for example, where it has been picked up by a microphone or an RF receiver. The decoder of FIG. 6 is particularly well adapted for detecting code symbols each of which includes a plurality of predetermined frequency components, e.g. ten components, within a frequency range of 1000 Hz to 3000 Hz. In this embodiment, the decoder is designed specifically to detect a message having a specific sequence wherein each symbol occupies a specified time interval (e.g., 0.5 sec). In this exemplary embodiment, it is assumed that the symbol set consists of twelve symbols, each having ten predetermined frequency components, none of which is shared with any other symbol of the symbol set. It will be appreciated that the decoder may readily be modified to detect different numbers of code symbols, different numbers of components, different symbol sequences, symbol durations, as well as components arranged in different frequency bands.

In order to separate the various components, a processor on device 200 repeatedly carries out FFTs on audio signal samples falling within successive, predetermined intervals. The intervals may overlap, although this is not required. In an exemplary embodiment, ten overlapping FFT's are carried out during each second of decoder operation. Accordingly, the energy of each symbol period falls within five FFT periods. The FFT's are preferably windowed, although this may be omitted in order to simplify the decoder. The samples are stored and, when a sufficient number are thus available, a new FFT is performed, as indicated by steps 434 and 438.

In this embodiment, the frequency component values are produced on a relative basis. That is, each component value is represented as a signal-to-noise ratio (SNR), produced as follows. The energy within each frequency bin of the FFT in which a frequency component of any symbol can fall provides the numerator of each corresponding SNR Its denominator is determined as an average of adjacent bin values. For example, the average of seven of the eight surrounding bin energy values may be used, the largest value of the eight being ignored in order to avoid the influence of a possible large bin energy value which could result, for example, from an audio signal component in the neighborhood of the code frequency component. Also, given that a large energy value could also appear in the code component bin, for example, due to noise or an audio signal component, the SNR is appropriately limited. In this embodiment, if SNR>6.0, then SNR is limited to 6.0, although a different maximum value may be selected. The ten SNR's of each FFT and corresponding to each symbol which may be present, are combined to form symbol SNR's which are stored in a circular symbol SNR buffer, as indicated in step 442. In certain embodiments, the ten SNR's for a symbol are simply added, although other ways of combining the SNR's may be employed. The symbol SNR's for each of the twelve symbols, markers and checksums are stored in the symbol SNR buffer as separate sequences, one symbol SNR for each FFT for the sequence of FFT's. After the values produced in the FFT's have been stored in the symbol SNR buffer, new symbol SNR's are combined with the previously stored values, as described below.

When the symbol SNR buffer is filled, this is detected in a step 446. In certain advantageous embodiments, the stored SNR's are adjusted to reduce the influence of noise in a step 452, although this step may be optional. In this optional step, a noise value is obtained for each symbol (row) in the buffer by obtaining the average of all stored symbol SNR's in the respective row each time the buffer is filled. Then, to compensate for the effects of noise, this average or "noise" value is subtracted from each of the stored symbol SNR values in the corresponding row. In this manner, a "symbol" appearing only briefly, and thus not a valid detection, may be averaged out over time.

After the symbol SNR's have been adjusted by subtracting the noise level, the decoder attempts to recover the message by examining the pattern of maximum SNR values in the buffer in a step 456. In certain embodiments, the maximum SNR values for each symbol are located in a process of successively combining groups of five adjacent SNR's, by weighting the values in the sequence in proportion to the sequential weighting (6 10 10 10 6) and then adding the weighted SNR's to produce a comparison SNR centered in the time period of the third SNR in the sequence. This process is carried out progressively throughout the five FFT periods of each symbol. For example, a first group of five SNR's for a specific symbol in FFT time periods (e.g., 1-5) are weighted and added to produce a comparison SNR for a specific FFT period (e.g., 3). Then a further comparison SNR is produced using the SNR's from successive FFT periods (e.g., 2-6), and so on until comparison values have been obtained centered on all FFT periods. However, other means may be employed for recovering the message. For example, either more or less than five SNR's may be combined, they may be combined without weighing, or they may be combined in a non-linear fashion.

After the comparison SNR values have been obtained, the decoder algorithm examines the comparison SNR values for a message pattern. Under a preferred embodiment, the synchronization ("marker") code symbols are located first. Once this information is obtained, the decoder attempts to detect the peaks of the data symbols. The use of a predetermined offset between each data symbol in the first segment and the corresponding data symbol in the second segment provides a check on the validity of the detected message. That is, if both markers are detected and the same offset is observed between each data symbol in the first segment and its corresponding data symbol in the second segment, it is highly likely that a valid message has been received. If this is the case, the message is logged, and the SNR buffer is cleared 466. It is understood by those skilled in the art that decoder operation may be modified depending on the structure of the message, its timing, its signal path, the mode of its detection, etc., without departing from the scope of the present invention. For example, in place of storing SNR's, FFT results may be stored directly for detecting a message.

Figure 11:
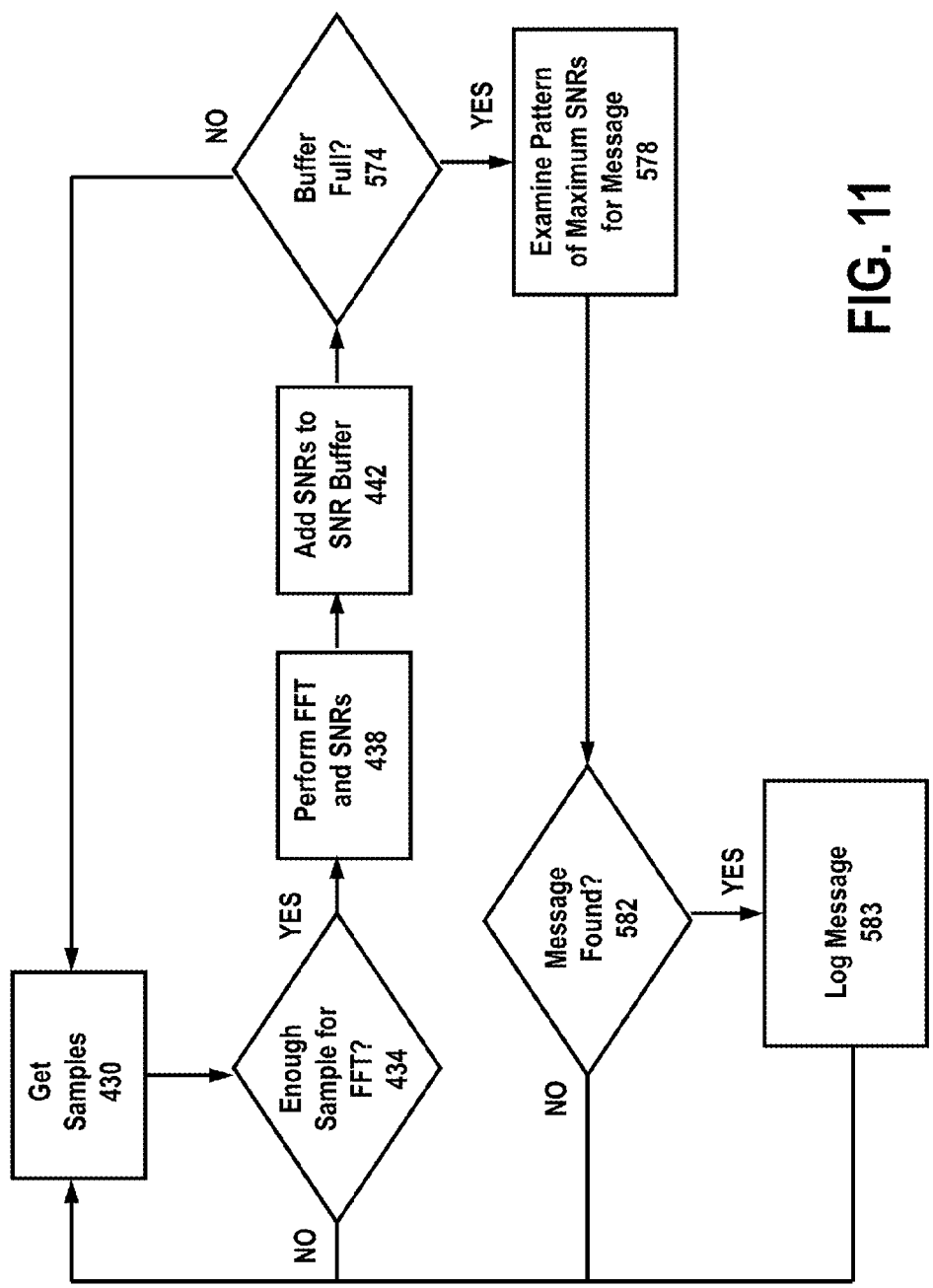
FIG. 11 is an exemplary flow chart illustrating another methodology for retrieving ancillary code from an encoded audio signal.

FIG. 11 is a flow chart for another decoder configuration according to a further advantageous embodiment likewise implemented by means of a processor controlled by a decoder application. The decoder application of FIG. 8 is especially adapted to detect a repeating sequence of code symbols (e.g., 5 code symbols) consisting of a marker symbol followed by a plurality (e.g., 4) data symbols wherein each of the code symbols includes a plurality of predetermined frequency components and has a predetermined duration (e.g., 0.5 sec) in the message sequence. It is assumed in this example that each symbol is represented by ten unique frequency components and that the symbol set includes twelve different symbols. It is understood that this embodiment may readily be modified to detect any number of symbols, each represented by one or more frequency components.

Steps employed in the decoding process illustrated in FIG. 11 which correspond to those of FIG. 10 are indicated by the same reference numerals, and these steps consequently are not further described. The FIG. 11 embodiment uses a circular buffer which is twelve symbols wide by 150 FFT periods long. Once the buffer has been filled, new symbol SNRs each replace what are than the oldest symbol SNR values. In effect, the buffer stores a fifteen second window of symbol SNR values. As indicated in step 574, once the circular buffer is filled, its contents are examined in a step 578 to detect the presence of the message pattern. Once full, the buffer remains full continuously, so that the pattern search of step 578 may be carried out after every FFT.

Since each five symbol message repeats every 2½ seconds, each symbol repeats at intervals of 2½ seconds or every 25 FFT's. In order to compensate for the effects of burst errors and the like, the SNR's R1 through R150 are combined by adding corresponding values of the repeating messages to obtain 25 combined SNR values SNRn, n=1, 2 . . . 25, as follows:

$$SNR_n = \sum_{i=0}^{5} R_{n+25i}$$

Accordingly, if a burst error should result in the loss of a signal interval i, only one of the six message intervals will have been lost, and the essential characteristics of the combined SNR values are likely to be unaffected by this event. Once the combined SNR values have been determined, the decoder detects the position of the marker symbol's peak as indicated by the combined SNR values and derives the data symbol sequence based on the marker's position and the peak values of the data symbols. Once the message has thus been formed, as indicated in steps 582 and 583, the message is logged. However, unlike the embodiment of FIG. 10 the buffer is not cleared. Instead, the decoder loads a further set of SNR's in the buffer and continues to search for a message. Similar error correction techniques described above may also be used.

As in the decoder of FIG. 10, it will be apparent from the foregoing to modify the decoder of FIG. 11 for different message structures, message timings, signal paths, detection modes, etc., without departing from the scope of the present invention. For example, the buffer of the FIG. 11 embodiment may be replaced by any other suitable storage device; the size of the buffer may be varied; the size of the SNR values windows may be varied, and/or the symbol repetition time may vary. Also, instead of calculating and storing signal SNR's to represent the respective symbol values, a measure of each symbol's value relative to the other possible symbols, for example, a ranking of each possible symbol's magnitude, is instead used in certain advantageous embodiments.

In a further variation which is especially useful in audience measurement applications, a relatively large number of message intervals are separately stored to permit a retrospective analysis of their contents to detect a media content change. In another embodiment, multiple buffers are employed, each accumulating data for a different number of intervals for use in the decoding method of FIG. 11. For example, one buffer could store a single message interval, another two accumulated intervals, a third four intervals and a fourth eight intervals. Separate detections based on the contents of each buffer are then used to detect a media content change.

In another embodiment, the checksums and offsets described above may be used as "soft metrics" to decode merged messages and correct any existing errors. Specifically, a multi-step process is used to calculate the soft metric of each symbol. First, the bin SNR is calculated for a given period of time as described above. Next, the bin SNRs are added to form symbol SNR for a given period of time. Symbol SNRs are then added across multiple periods of time that correspond to a message symbol interval, with weighting to compensate for the effects of the FFT window, and noise subtraction for that symbol within other portions of the message. Each weighted symbol SNR is taken from the previous step in each message position, and divided by the sum of all other weighted symbol SNRs for that message position. These results are then preferably scaled (or optionally squared), resulting in a "ratio of ratios," which is represents a "score" or value of how strong each symbol is relative to its neighbors within the same message position. Applying these soft metrics, the decoder may find any cases that violate the encoded message structure in FIG. 8, and then iteratively performs combinations of error corrections to find a solution with the strongest set of symbol soft metrics (values). Additionally, if the winning soft metrics are too low (i.e. below some threshold), the corrected message may be discarded, or marked as suspicious, due to a higher probability of false positives.

As an example, using Reed-Solomon error correction (15, 9) the system can correct (15−9)/2=3 symbol errors. Using additional passes in the example, and considering the symbols with the lowest "soft metrics," up to 6 symbol errors may be corrected. Generally speaking, in coding theory, Reed-Solomon (RS) codes are non-binary cyclic error-correcting codes for detecting and correcting multiple random symbol errors. By adding t check symbols to the data, a RS code can detect any combination of up to t erroneous symbols, or correct up to t/2 symbols. As an erasure code, RS code can correct up to t known erasures, or it can detect and correct combinations of errors and erasures. Furthermore, RS codes are suitable as multiple-burst bit-error correcting codes, since a sequence of b+1 consecutive bit errors can affect at most two symbols of size b. The choice of t is up to the designer of the code, and may be selected within wide limits.

Turning to FIG. 12, one example of a Reed-Solomon (15,9) configuration is illustrated, where the symbols with the maximum metrics (value) for each message position (1-15) are highlighted. In this example, a plurality of passes (e.g., 1-7) are made over the message symbols until a valid message is found. Under an exemplary first step, the highest soft metric value at each message position is processed and identified (100, 110, 60, 97, 107, 93, etc.), and a threshold metric or value may be set. In an exemplary first pass, the same values are identified, except that the lowest value, found in message symbol position 11 (50), is assumed to be erroneous, especially if it is below the threshold value. The passes may continue on the message to identify further lowest values, until a certain number of invalid values are identified. Thus, continuing the process through seven passes, the exemplary results would be:

Pass 2: message symbol position 10 is identified having the next lowest value (52);

Pass 3: message symbol position 14 is identified having the next lowest value (54);

Pass 4: message symbol position 3 is identified having the next lowest value (60);

Pass 5: message symbol position 12 is identified having the next lowest value (62); and Pass 6: message symbol position 13 is identified having the next lowest value (70).

After the last pass, message positions 11, 10, 14, 3, 12, 13 would be assumed to be errors (erasures), as they are the lowest maximum values.

Figure 13:
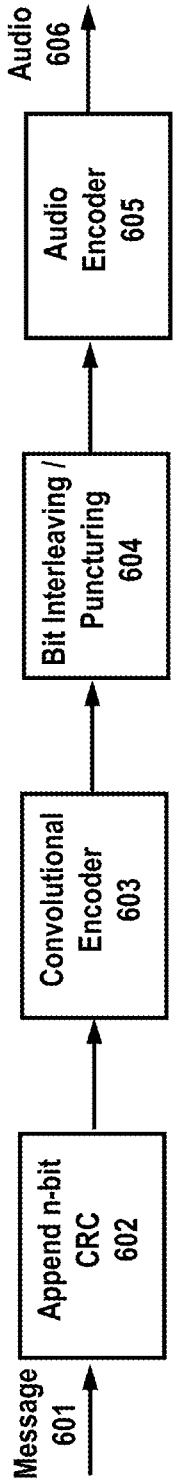
FIGS. 13 and 14 are other exemplary embodiments covering techniques for error correction on an encoded audio signal.

It is understood by those skilled in the art that other error correction techniques are applicable as well. One such technique involves the use of a convolutional encoder/decoder, which may be incorporated as part of any of the audio encoders/decoders described herein. FIG. 13 provides one example of a convolutional encoder configured to utilize the soft metrics described above to drive a soft output Viterbi decoder shown in FIG. 14. The encoder block diagram of FIG. 13 has a message ID 501 that has an n-bit CRC appended in 602. In one exemplary embodiment, the encoder may append a 16 bit CRC to a 38-bit message, which would result in a 54 bit input to convolutional encoder 603. Using r=⅓, the convolutional encoder may output a 162 bit string to bit interleaving and puncturing block 604, which may output a 156 bit string to audio encoder 605, which uses the string for error correction in the audio encoding described above.

Figure 14:
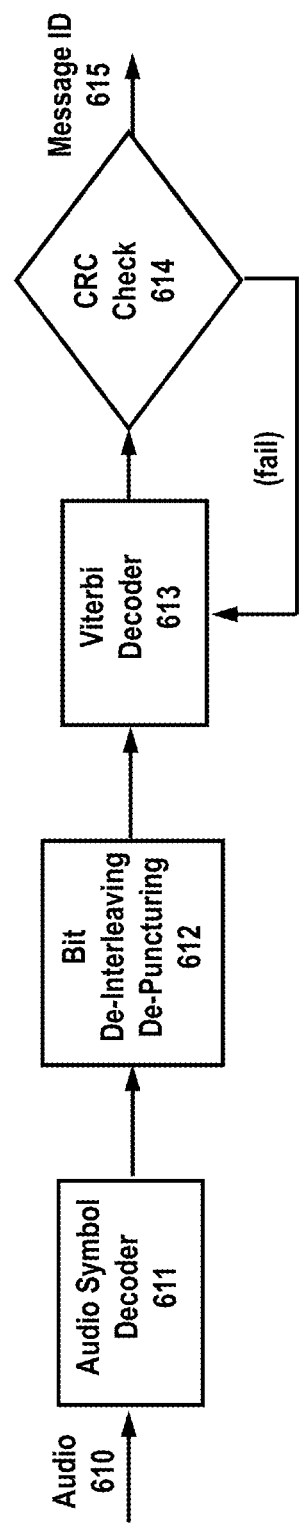

Continuing with the example, a decoding process is illustrated in FIG. 14, where error-corrected encoded audio 610 is received in audio symbol decoder 611, which subjects the audio (156 bytes) to bit interleaving and de-puncturing in block 612. The resulting 162 bytes are used in soft Viterbi decoder 613 to produce the 54 bits that are used in CRC check 614 for error correction. If the CRC check fails, the process reverts to Viterbi decoder 613. If the CRC check passes, the decoded message ID 615 from the audio is read out.

Turning to FIG. 15, an exemplary decoder interface process is disclosed, where device (200) executes a decoder operation. The decoder in this example may be written in C, or any suitable code known in the art. At the beginning, a current version of the decoder is called and initialized in 430. At this point, use of the decoder may be dependent upon the satisfaction of an encryption key 431, which may be advantageous for limiting use of the decoder only to authorized users. The decoder interface security may comprise a required file containing encrypted decoder initialization parameters that may be used as an input for the decoder. The parameters may include pointer(s) to decoder memory, size of the decoder memory, pointer to encrypted decoder initialization parameters and pointer to an encryption key provided by the research entity, if not supplied to the application as a compile-time switch. Of course, if security is not an issue, the encryption steps may be omitted. Once any security/encryption is satisfied, the decoder loads initialization parameters that include allocating memory for audio decoding in step 432. Preferably, memory is allocated prior to executing other functions in the decoder. As audio is received in device 200, the audio is sampled 433 and transformed (e.g., FFT) in 434. As one example, the sampled audio may comprise 2048 16-bit monophonic audio samples obtained through an 8k sample rate, while the transformation may result in 1024 FFT bin results. During the decoding process, may use the initialized pointer to access decoder memory to obtain arrays(s) of transformed bin powers returned from the transformations, and utilize them to read code in 435. Once the code is read it may be stored in memory and transmitted to a remote location for audience measurement purposes.

In an alternate embodiment, multiple instances of the decoder may be initialized multiple times using different memory areas. In such a case, the decoder application would be responsible for keeping track of which memory pointers are used in subsequent calls to initialize and retrieve code from the proper decoder.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method of decoding audio data acoustically embedded with a message structure comprising a sequence of message symbols coexisting within two encoded layers along a time base of the audio data, each message symbol comprising a combination of substantially single-frequency components and a symbol interval within a time base of the audio data, comprising:
   detecting the substantially single-frequency components of the message symbols; and
   detecting the message symbols based on the detected substantially single-frequency components of the message symbols, the detection based on a synchronization of the message symbols between the two encoded layers.

2. The method of claim 1, further comprising performing error correction on at least some of the detected message symbols.

3. The method of claim 2, wherein the error correction comprises a Reed-Solomon error correction.

4. The method of claim 2, wherein the error correction comprises a convolutional code error correction.

5. The method of claim 1, further comprising subjecting the detected message symbols to a cyclic redundancy check (CRC).

6. The method of claim 5, further comprising outputting the detected message symbols if the CRC has been satisfied.

7. A method of decoding audio data acoustically embedded with a message structure comprising a sequence of message symbols coexisting within two encoded layers along a time base of the audio data, each message symbol comprising a combination of substantially single-frequency components and a predefined symbol interval within a time base of the audio data, comprising:
   detecting the substantially single-frequency components of the message symbols;
   detecting the message symbols based on the detected substantially single-frequency components thereof, wherein the detection is based on a synchronization of the message symbols between the two encoded layers; and
   performing error correction on at least some of the detected message symbols, wherein the error correction comprises determining a largest signal-to-noise ratio (SNR) value of the message symbols for each of a plurality of message positions.

8. The method of claim 7, wherein the error correction comprises determining the smallest SNR value of the message symbols for each of a plurality of message positions.

9. The method of claim 8, wherein the error correction comprises identifying the smallest SNR values among a predetermined number of the plurality of message positions.

10. The method of claim 9, wherein the error correction comprises discarding symbols identified as having the smallest SNR values among the predetermined number of the plurality of message positions.

11. A decoder to decode audio data acoustically embedded with a message structure comprising a sequence of message symbols coexisting within two encoded layers along a time base of the audio data, each message symbol comprising a combination of substantially single-frequency components and a symbol interval within a time base of the audio data, comprising:
   a first decoder portion to detect the substantially single-frequency components of the message symbols; and
   a second decoder portion to detect the message symbols based on the detected substantially single-frequency components of the message symbols, the detection based on a synchronization of the message symbols between the two encoded layers.

12. The decoder of claim 11, further comprising a third decoder portion to perform error correction on at least some of the detected message symbols.

13. The decoder of claim 12, wherein the error correction comprises a Reed-Solomon error correction.

14. The decoder of claim 12, wherein the error correction comprises a convolutional code error correction.

15. The decoder of claim 11, wherein the decoder is to subject the detected message symbols to a cyclic redundancy check (CRC).

16. The decoder of claim 15, wherein the decoder is to output the detected message symbols if the CRC has been satisfied.

17. A decoder configured to decode audio data acoustically embedded with a message structure comprising a sequence of message symbols coexisting within two encoded layers along a time base of the audio data, each message symbol comprising a combination of substantially single-frequency components and a predefined symbol interval within a time base of the audio data, comprising:
 a first decoder portion for detecting the substantially single-frequency components of the message symbols;
 a second decoder portion for detecting the message symbols based on the detected substantially single-frequency components thereof, wherein the detection is based on a synchronization of the message symbols between the two encoded layers; and
 a third decoder portion configured to perform error correction on at least some of the detected message symbols, wherein the error correction of the third decoder portion is configured to determine a largest signal-to-noise ratio (SNR) value of the message symbols for each of a plurality of message positions.

18. The decoder of claim 17, wherein the error correction of the third decoder portion is configured to determine the smallest SNR value of the message symbols for each of a plurality of message positions.

19. The decoder of claim 18, wherein the error correction of the third decoder portion is configured to identify the smallest SNR values among a predetermined number of the plurality of message positions.

20. The decoder of claim 19, wherein the error correction of the third decoder portion is configured to discard symbols identified as having the smallest SNR values among the predetermined number of the plurality of message positions.

* * * * *